(12) United States Patent
Ratcliffe

(10) Patent No.: US 8,035,984 B2
(45) Date of Patent: Oct. 11, 2011

(54) SUBSTRATE STRUCTURES AND METHODS FOR ELECTRONIC CIRCUITS

(76) Inventor: William R. Ratcliffe, Thousand Oaks, CA (US)

( * ) Notice: Subject to any disclaimer, the term of this patent is extended or adjusted under 35 U.S.C. 154(b) by 388 days.

(21) Appl. No.: 12/405,612

(22) Filed: Mar. 17, 2009

(65) Prior Publication Data
US 2009/0237897 A1 Sep. 24, 2009

Related U.S. Application Data

(60) Provisional application No. 61/070,146, filed on Mar. 19, 2008, provisional application No. 61/101,926, filed on Oct. 1, 2008.

(51) Int. Cl.
*H05K 1/11* (2006.01)
(52) U.S. Cl. ........................................ 361/795; 361/763
(58) Field of Classification Search .......... 361/761–765, 361/775–784, 792–795, 803; 174/255–258; 257/684–686
See application file for complete search history.

(56) References Cited

U.S. PATENT DOCUMENTS

| | | | | |
|---|---|---|---|---|
| 5,453,405 A | 9/1995 | Fan et al. | ...................... | 437/228 |
| 6,414,382 B1 | 7/2002 | Hashimoto | ................... | 257/676 |
| 6,458,472 B1 | 10/2002 | Konarski et al. | .............. | 428/620 |
| 6,593,220 B1 | 7/2003 | Yu et al. | ......................... | 438/612 |
| 6,784,020 B2 | 8/2004 | Lee et al. | ....................... | 438/106 |
| 6,791,119 B2 | 9/2004 | Slater et al. | ..................... | 257/99 |
| 6,885,035 B2 | 4/2005 | Bhat et al. | ....................... | 257/99 |
| 6,903,376 B2 | 6/2005 | Shen et al. | ...................... | 257/81 |
| 7,026,659 B2 | 4/2006 | Slater et al. | ..................... | 257/98 |
| 7,037,742 B2 | 5/2006 | Slater et al. | ..................... | 438/39 |
| 7,119,447 B2 | 10/2006 | Larking | ......................... | 257/784 |
| 7,897,880 B1 * | 3/2011 | Goergen et al. | ............... | 174/262 |
| 7,916,492 B1 * | 3/2011 | Zhong et al. | .................. | 361/760 |

* cited by examiner

*Primary Examiner* — Khiem Nguyen
(74) *Attorney, Agent, or Firm* — Koppel, Patrick, Heybl & Philpott

(57) ABSTRACT

Substrate structure embodiments generally have first and second sides and are configured to form at least one opening that communicates between the first and second sides. A circuit path is carried on the first side and extended over the opening wherein the circuit path has a near side facing the substrate and has a far side facing away from the substrate. A circuit element has at least one bonding pad and is inserted into the opening after which the conductive bump is arranged to join the pad to the path. In another embodiment, the bump joins the pad to the near side of the path. In another embodiment, the path defines a hole and the bump fills the hole. In yet another system embodiment, the opening comprises a recess and associated vias. These embodiments may also have a second conductive circuit path carried on the first side and having a near side facing the substrate and a far side facing away from the substrate. The systems may then include a second circuit element and at least one second conductive bump.

20 Claims, 5 Drawing Sheets

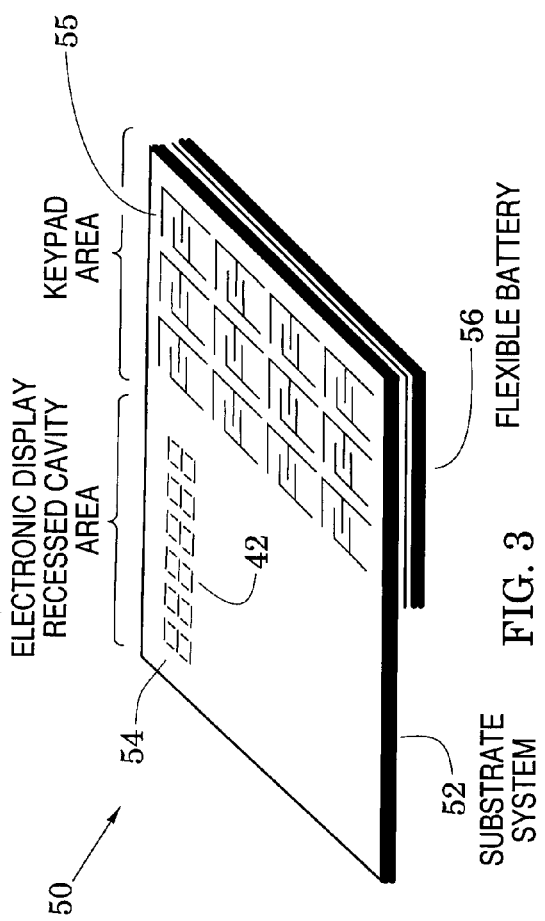
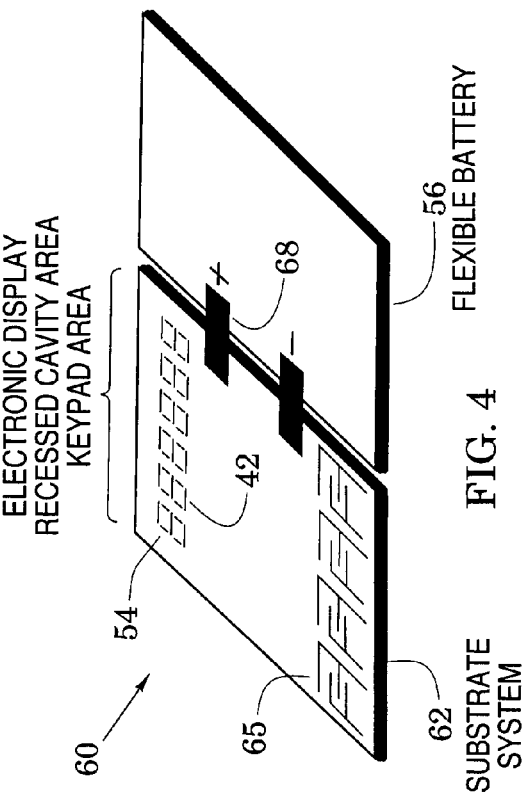

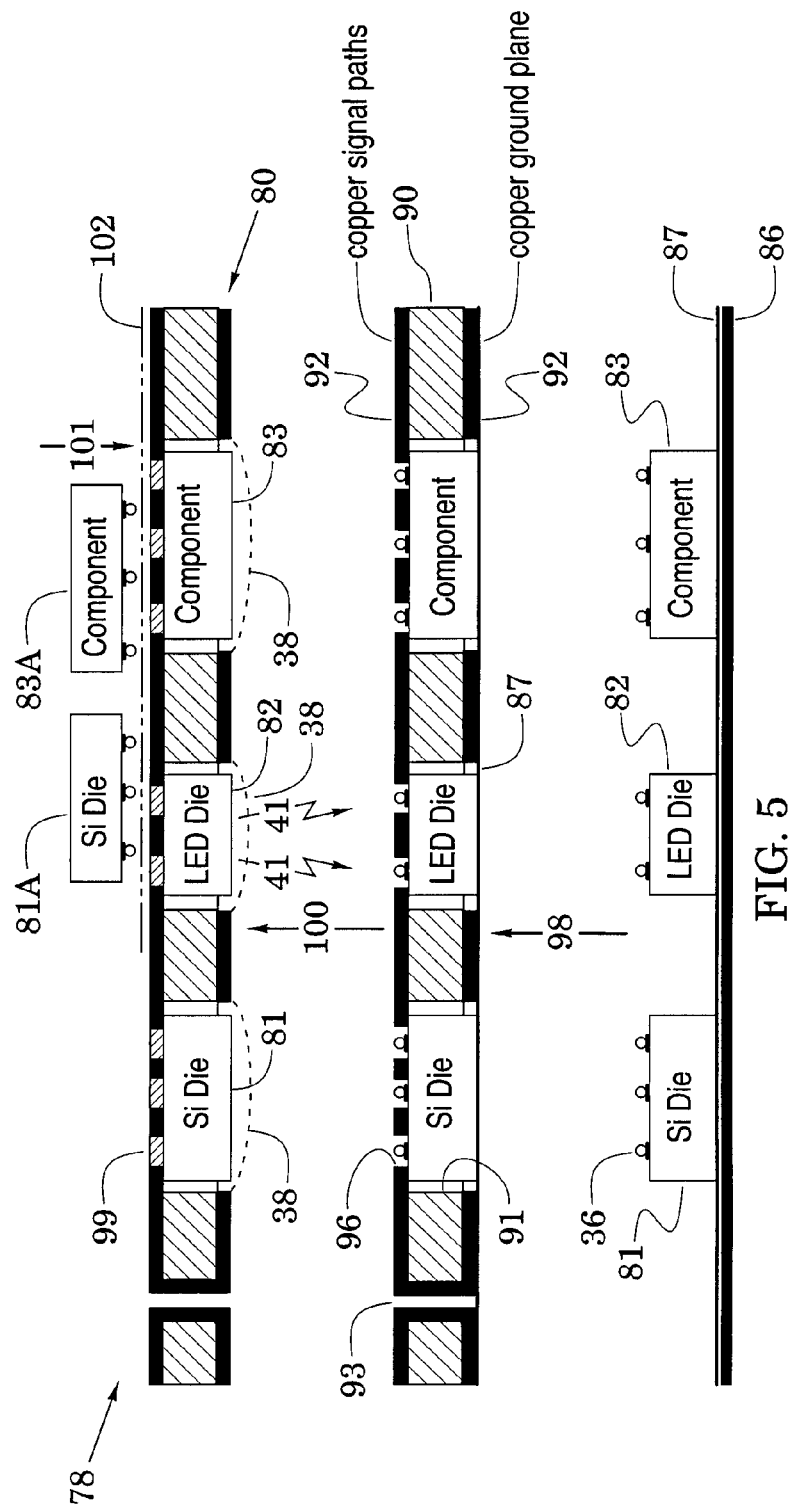

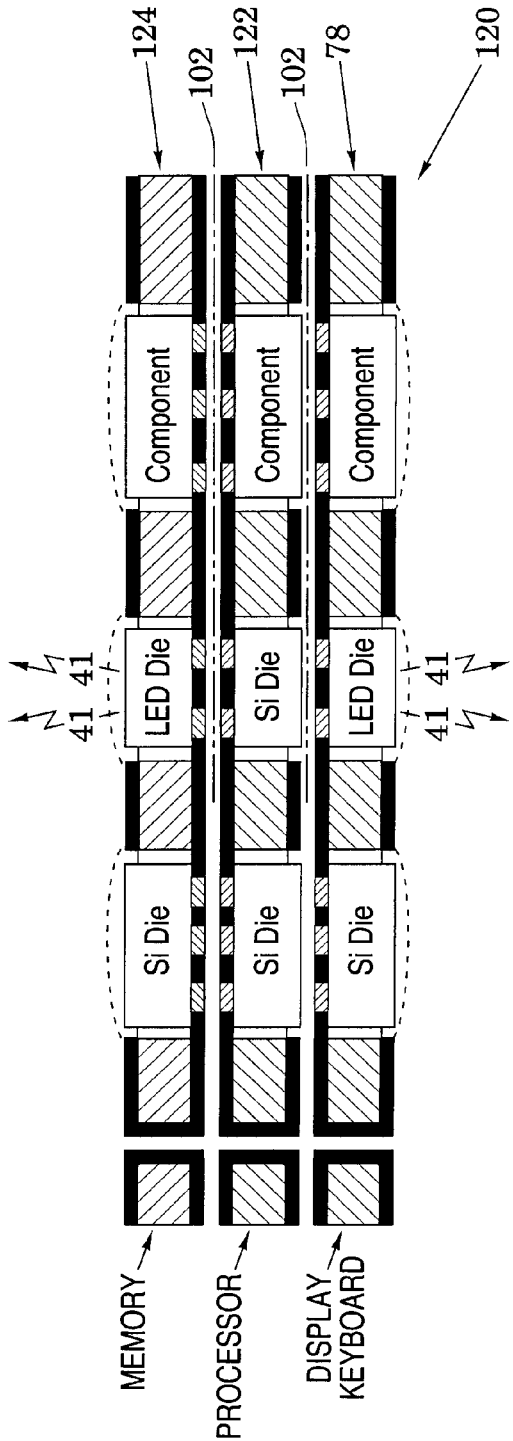

| CONNECTIVE STRUCTURES | | | | | |
|---|---|---|---|---|---|
| CONF'GRTN | COMPOSITION | PREPARATION | APPLIED TO PART | ARRANGEMENT WITH SIGNAL LINES | PROCESS | ADVANTAGES |
| BALLS | EUTECTIC SOLDER | ETCHED | BEFORE INSERTION | ABUT SUBSTRATE SIDE | REFLOW | ENHANCED RESOLUTION, DENSITY, THINNESS, AND HEAT FLOW |
| DISCS | CONDUCTIVE EPOXY | LASERED | AFTER INSERTION | COPLANAR | CURE | |
| PADS | | SCREENED | | | HEAT | |
| | | ROLL STAMPED | | | PRESSURE | |
| FILM | ANISOTROPIC | VERTICAL STAMPED | | | | |

SUBSTRATE STRUCTURES AND METHODS FOR ELECTRONIC CIRCUITS

CROSS REFERENCES TO RELATED APPLICATIONS

This application claims the benefit of U.S. Provisional Application Ser. No. 61/070,146 filed Mar. 19, 2008 and of U.S. Provisional Application Ser. No. 61/101,926 filed Oct. 1, 2008.

BACKGROUND OF THE INVENTION

1. Field of the invention

The present disclosure relates generally to electronic circuit substrates.

2. Description of the Related Art

Although various substrate structures and methods exist for fabrication of electronic circuits (e.g., including the processes of wedge bonding, wire bonding and flip chip arrangements), there remains a need to enhance various parameters (e.g., size, density and cost) of electronic circuits.

For example, the first paragraph of the Preface of John H. Lau's and S. W. Kicky Lee's McGraw-Hill's Hand Book on Chip Scale Packaging (design, materials, processes, reliability, and applications) states: "Theoretically speaking, one of the most cost-effective packaging techniques is direct chip attach (DCA) which is directly attaching the chip on the printed circuit board PCB), or on the flexible printed circuit (FPC), or on the glass (COG) "without" a package. However, because of the cost and infrastructure in supplying the known good die (KGD) and the corresponding fine line and spacing of PCB, or FPC, or glass, most of the industry are still working on these issues".

BRIEF SUMMARY OF THE INVENTION

The present disclosure is generally directed to substrate structures and methods for electronic circuits. The drawings and the following description provide an enabling disclosure and the appended claims particularly point out and distinctly claim disclosed subject matter and equivalents thereof.

BRIEF DESCRIPTION OF THE DRAWINGS

FIGS. 3 and 4 are isometric views of applications of the substrate system embodiment of FIG. 1.

FIG. 5 is illustrates substrate fabrication processes that result in another substrate system embodiment;

FIG. 6 is a view, similar to that of a final portion of FIG. 5, which illustrates another substrate system substrate;

FIG. 7 is a chart that summarizes connective structures of FIGS. 1-6; and

FIG. 8 illustrates a substrate system formed with structures of FIGS. 1-6.

DETAILED DESCRIPTION OF THE INVENTION

FIGS. 1-8 illustrate substrate system embodiments that are configured for efficient and cost effective carrying of circuit elements (e.g., integrated circuit chips, discrete active and passive electronic elements, and light-emitting diode (LEDs).

The substrate systems generally include a dielectric substrate, at least one conductive path, a circuit element, and a conductive bump.

The substrate has first and second sides and is configured to form at least one opening that communicates between the first and second sides. The circuit path is carried on the first side and extended over the opening wherein the circuit path has a near side facing the substrate and has a far side facing away from the substrate. The circuit elements have at least one bonding pad and is inserted into the opening. Finally, the conductive bump is arranged to join the pad to the path. In a system embodiment, the bump joins the pad to the near side of the path. In another system embodiment, the path defines a hole and the bump fills the hole. In another system embodiment, the opening comprises a recess and associated vias.

All of these substrate system embodiments may also have a second conductive circuit path carried on the first side and having a near side facing the substrate and a far side facing away from the substrate. The systems may then include a second circuit element and at least one second conductive bump. The second circuit element has at least one second bonding pad and the second conductive bump joins the second bonding pad to the far side of the second path.

The substrate system thus efficiently couples the second circuit element to the far side of one circuit path and couples the first circuit element to the near side of another circuit path. These system arrangements provide a number of packaging options that can be used to enhance packaging efficiency and reduce system costs.

Figure 1:
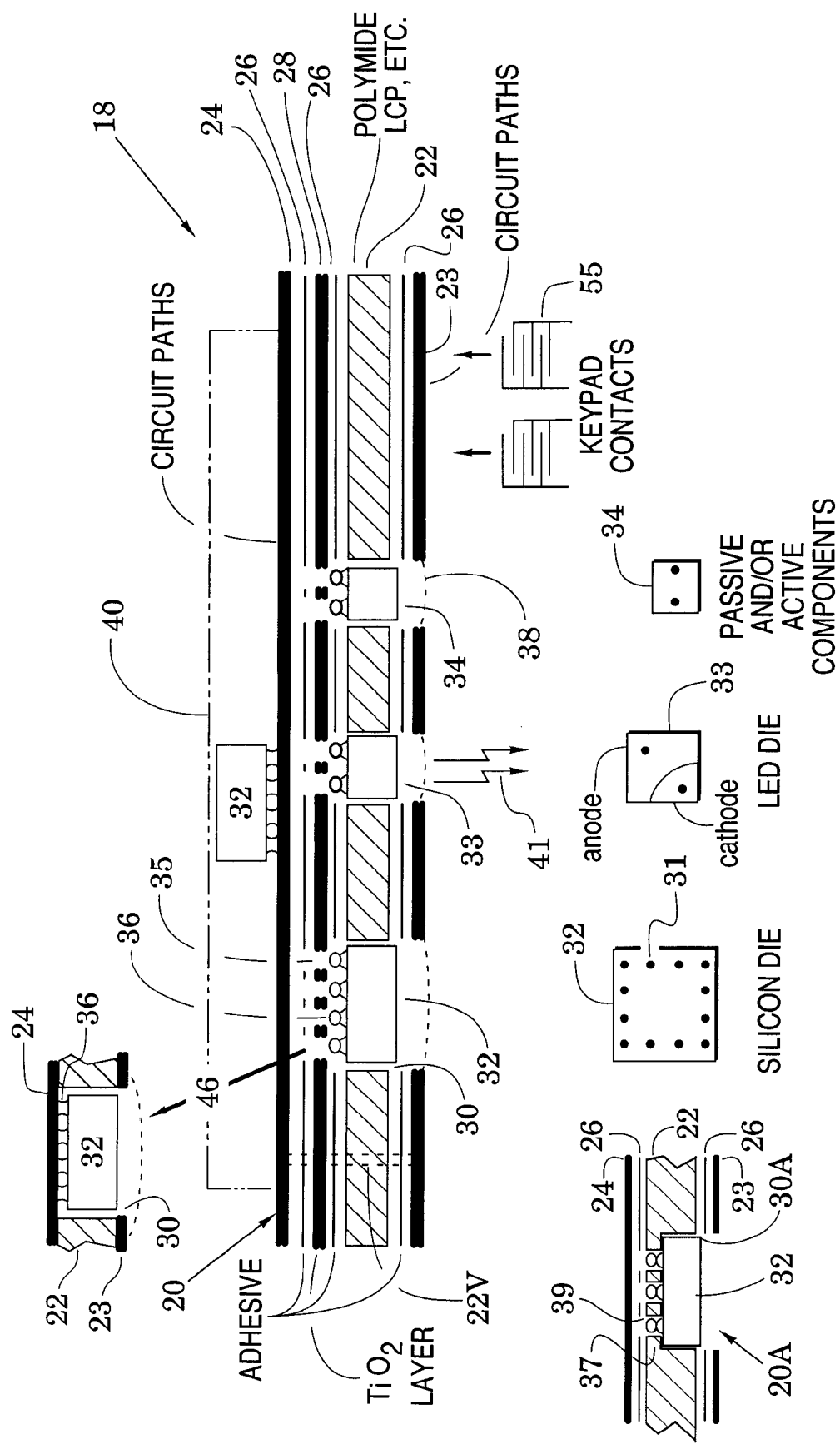
FIG. 1 is a sectioned side view of an electronic circuit that is formed with a substrate system embodiment.

In particular, FIG. 1 illustrates an electronic circuit 18 that is formed with a substrate system 20. The substrate system is particularly suited for packaging a wide range of circuit elements such as discrete active and passive electronic elements, semiconductor dies and chips, light-emitting diode (LED) dies, and various display systems. The display systems may include monolithic LED displays that are configured, for example, in dot matrix and/or multiple-segment formats to represent numeric and alpha displays. These systems may include other display technologies such as reflective electrochromics and emissive organic LED's (OLED's), and flip chip assemblies. The circuit elements in these systems may be formed of various semiconductor materials (e.g., silicon (Si), germanium (Ge) and gallium (Ga).

In an important feature, the substrate system 20 is configured to reduce the size of the electronic circuit 18 by facilitating the bumping of electronic components to the substrate side of a conductive layer of the system. In another important feature, the substrate system 20 facilitates the bumping of electronic components in a coplanar relationship with the conductive layer.

At this point, it is recalled that an integrated circuit chip or die is a set of microminiaturized array of electronic circuits and components fabricated (e.g., diffused and/or implanted) in semiconducting material (e.g., silicon). It is noted that die and chip are used synonymously herein. It is also recalled that "flip chip" generally refers to a packaging technique in which the active contact area of an integrated circuit chip is "flipped over" to face a carrier (e.g., a printed circuit board) and that that "bumping" is generally understood to be a technique for attaching the flipped chip to the carrier in which small balls of solder are attached to the chip's bonding pads (31 in FIG. 1) and then reflowed (i.e., melted) in place on the carrier. Spaces between the chip and the carrier may be underfilled with epoxy.

In particular, the substrate system 20 of FIG. 1 includes a dielectric substrate 22. In one embodiment, the substrate can be formed of various substrate materials (e.g., polyimides and liquid crystal polymers) that cause it to be flexible. In another embodiment, the substrate can be formed of materials (e.g., FR4) that cause it to be substantially rigid. The dielectric substrate 22 is preferably layered with lower and upper conductive layers 23 and 24 which are formed of conductive metal (e.g., copper, nickel and/or gold). These layers may be coupled to the substrate 22 with adhesive layers 26. In a circuit embodiment, the lower conductive layer 23 may serve primarily as a ground plane and the upper conductive layer 24 may define circuit paths (that interconnect circuits that generally lie in a circuit area 40). In other embodiments, both conductive layers may include circuit paths. Selected portions of the lower and upper conductive layers 23 and 24 may be coupled together with conductive vias 22V.

If desired, an intermediate insulating layer 28 (and another adhesive layer) can be inserted between the upper conductive layer 24 and the dielectric 22. The insulating layer 28 may be formed of materials such as titanium dioxide ($TiO_2$) which can also serve as a heat source to accelerate the dissipation of the heat away from the electronic components. The $TiO_2$ could also be mixed into the adhesive layer between the circuit layer and the dielectric.

The substrate 22 (and lower conductive layer 23 and associated adhesive layer 26) are configured to define openings in the form of apertures 30 that communicate between the conductive layers 23 and 24 and which may be specifically sized to receive circuit elements such as semiconductor dies and chips 32, light-emitting diode (LED) dies and chips 33, and various passive and/or active components 34. The term circuit element is used herein to collectively embrace all of the elements 32, 33 and 34. As shown in FIG. 1, the circuit elements have bonding pads 31. The apertures 30 can be formed with conventional processes such as laser ablating or chemical etching.

Discrete vias 35 can then be ablated or etched through the adhesive and insulating layers 26 and 28 to accept and isolate individual bumps 36 that are carried on the bonding pads 31 of the circuit elements so that the elements may be electrically coupled to respective contact points or pads on the near side of the upper conductive layer 24. The bumps can be formed, for example, with solder or conductive epoxy and shaped, for example, in the form of balls, discs or pads. The insulating layer 28 is particularly useful for insuring that the bumps 36 are only coupled to the near side of the upper conductive layer 24 and not inadvertently coupled to anything else (e.g., to each other).

In a sketch of the LED die 33 in FIG. 1, it is noted that the die is arranged so that both LED electrodes are available for receiving respective bumps which are then coupled to the near side of the upper conductive layer 24. In another embodiment, micro sized thin eutectic pads and/or discs can be wetted and attached to each LED's bonding pads 31 before the singulation and scribing processes which produce the LEDs from a wafer. Alternatively, these eutectic pads can be attached to wetted contact pads on the near side of the upper conductive layer 24.

In a particular embodiment, LED electrodes (anode and cathode) are available for receiving respective bumps which are then coupled to respective portions (e.g., traces) on the near side of the upper conductive layer 24. It is noted that LEDs are often formed over a fabrication support layer (e.g., a layer of sapphire, silicon carbide or gallium arsenide). Although the LED can effectively emit its light 41 through this support layer, the layer may also be reduced or removed as a sacrificial element in other embodiments to enhance light emission.

The attachment processes described above can be accomplished, for example, by
(a) the use of laser masks to define the individual apertures 30 and vias 35,
(b) the programming and appropriate altering of laser parameters such as frequency, power, and beam dimensions, and
(c) using a plurality of laser heads that each conduct a respective ablating process.
Alternatively, discrete chemical etching processes can be achieved through the use of masking layers and different chemical baths. Another attachment process can be used to employ and laminate the intermediate insulating layer 28 between the upper conductive layer 24 and the dielectric substrate 22 and then use appropriate lasering and/or chemical etching processes to achieve the vias 35 which receive the bumps 36. This process may be accomplished, for example, with various lasering/chemical etching processes in order to achieve through vias for the bumped components.

As shown in FIG. 1, a non-conductive polymer 38 is preferably applied over the flip chip mounted chips to increase the physical integrity of the system. In an embodiment which includes LED dies that emit light, the polymer 38 can be configured to alter the index of refraction to closely match that of the LED die and thereby increase photon output. In other LED embodiments, diffusion elements (e.g., phosphors, $TiO_2$, and quartz beads) can be imbedded in the polymer 38 so to act as a diffusion element to diffuse the light 41 emitted from the LEDs.

In another substrate system embodiment 20A of FIG. 1, the substrate is configured to define an opening in the form of a recess 30A and at least one via 39 that together communicate between the conductive layers 23 and 24 and which may be specifically sized to receive electronic components. This combination leaves a thin substrate strip 37 at the top of the recess. Vias 39 are then formed through the remaining strip 37 and are also formed in the associated adhesive layer 26. A die 32 is then received into the recess with the die's bumps passing through the vias in the strip and the adhesive layer. The bumps are then coupled to the near side of the upper conductive layer 24. Various conventional cleaning processes may be used to insure that a reliable bond is formed between the bumps and the conductive layer's lower side.

It was noted above that the dielectric substrate 22 of the substrate system 20 of FIG. 1 may be configured to form apertures 30 to receive integrated circuit chips and facilitate coupling of the chips to circuit paths in the upper conductive layer 24 with bumps. It was further noted above that the dielectric substrate 22 of the substrate system may be configured to form recesses 30A to receive integrated circuit chips and also form vias 39 which facilitate coupling of the chips to circuit paths in the upper conductive layer 24 with bumps. Generically, the apertures and the combination of the recesses and vias may thus be collectively referred to as openings.

The substrate system 20 of FIG. 1 thus facilitates the bumping of electronic components to the near side of the upper conductive layer 24. The components are received into the apertures 30 or the recesses 30A with their associated solder bumps 36 passing through respective vias 35 to thereby couple to the near side of the upper conductive layer 24. It is noted that each of the conductive layers 23 and 24 have a near side that faces towards the substrate 22 and a far side that faces away from the substrate. An arrow 46 in FIG. 1 points to a sketch which illustrates the chip 32 after its solder bumps 36 have been reflowed via an appropriate process (e.g., application of temperature or a combination of temperature and pressure) to thereby adhere to the near side of respective circuit paths in the upper conductive layer 24. If the bumps 36 consist of conductive epoxy, they can be altered and cured via an appropriate process (e.g., application of temperature or radiated energy) to thereby adhere to the near side.

Other various electronic circuit components can also be mounted in conventional manners on the upper side of the upper conductive layer 24 as indicated by the integrated circuit die 32 in the outlined circuit area 40 which has its solder bumps reflowed to the far side of the upper conductive layer 24. Other circuit structures may also be installed in this area (e.g., a heat sink that may, for example, contact portions of the upper conductive layer 24). The integrity of the components with the system can be enhanced with the polymer 38.

In FIG. 1, it is important to note that one of the integrated circuit chips 32 is mounted to the near side of a circuit path while another integrated circuit chip is mounted to the far side of that circuit path (or of another circuit path). This novel arrangement substantially enhances packaging efficiency.

Figure 2:
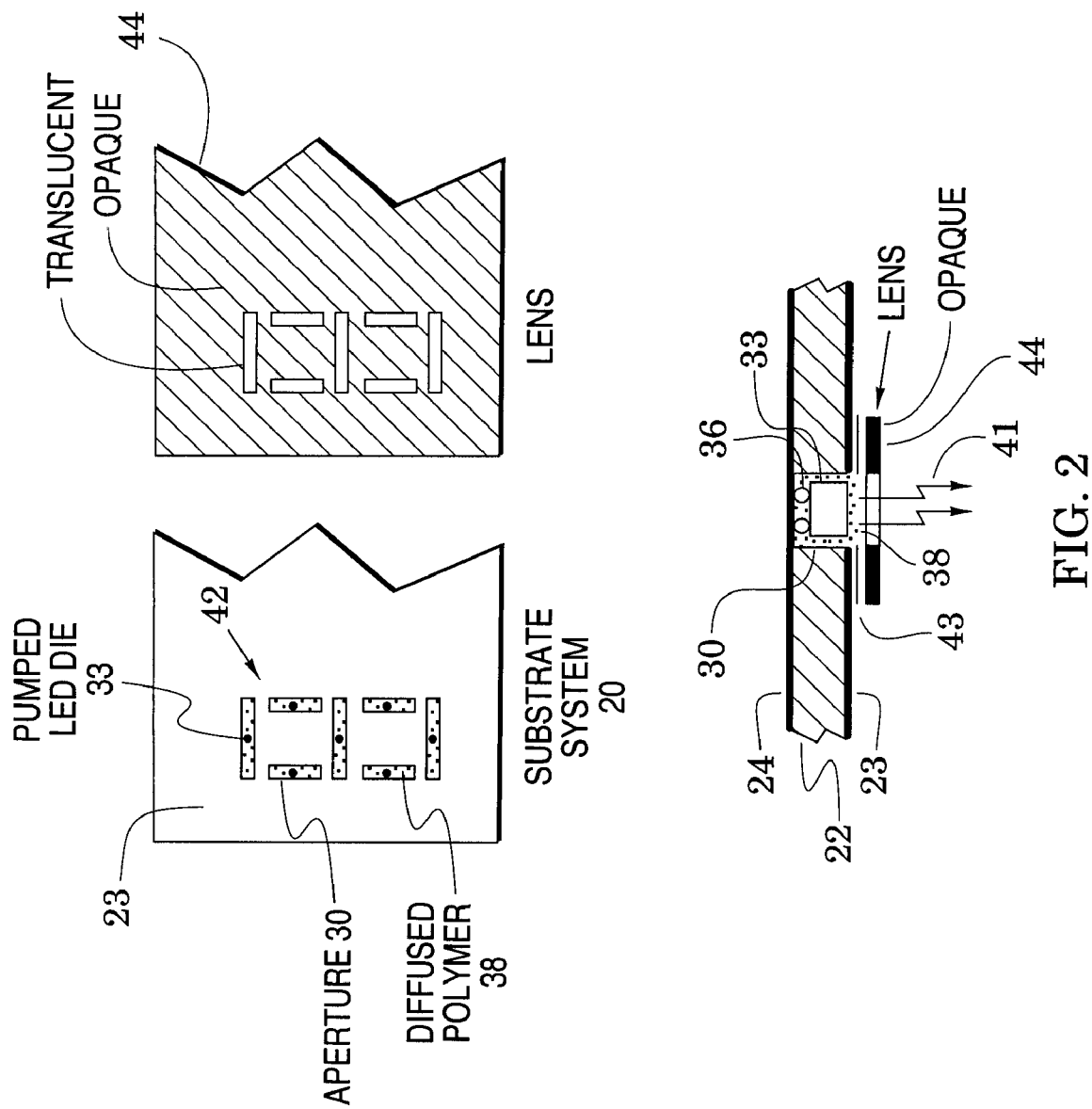
FIG. 2 is a view of a portion of FIG. 1 which illustrates another substrate system embodiment that includes a lens.

FIG. 2 includes a view of the lower conductive layer 23 of the substrate system 20 of FIG. 1 wherein each of a plurality of the aperture 30 of FIG. 1 is shaped as a rectangular segment and the segments are arranged to define a character 42 which could be a letter or number (an exemplary number eight is shown). One of the LED die 33 of FIG. 1 is shown in each of the segment-shaped apertures and the remainder of each aperture is filled with the polymer 38 which may be chosen, in this embodiment to enhance the light 41 from the LED (e.g., by altering the index of refraction to closely match that of the LED die or by including diffusion elements to diffuse the emitted light).

As shown in a sectional view of FIG. 2 that is similar to the view of FIG. 1, each of the dies 33 is bumped to couple to the near side of the upper conductive layer 24 (as introduced in FIG. 1). An adhesive 43 can be used to attach a lens 44 to the lower conductive layer 23 which is spaced from the upper conductive layer 24 by the substrate 22. The die 33 can be activated via the substrate system (20 in FIG. 1) so that it emits light 41 away from its aperture 30 and through the lens 44.

As shown in plan view at the upper right of FIG. 2, the lens 44 is generally opaque but has translucent portions that correspond to the character 42 that is defined by the rectangular segments. That is, the lens 44 is preferably configured to be substantially opaque except for regions that lie over the apertures 30. The translucent portions pass and transform the light 41 in various selected ways. The translucent portions may have a color that closely matches the wavelength of the emitted light (e.g., red for red LEDs, blue for blue LEDs, and so on). The translucent portions may include holographic features such as those available from various sources (e.g., Liminit of Torrance, California) that enhance the appearance of the emitted light. The polymer 38 (referred to above) may be added in and/or over the apertures so as to further diffuse emitted light and define the lens characters.

Having described the substrate system 20 of FIGS. 1 and 2, attention is directed to the circuit embodiments 50 and 60 of FIGS. 3 and 4 whose fabrication can be realized with the structures of the system 20. After describing the embodiments 50 and 60, attention will be directed to FIGS. 5A-5C and 6 which illustrate further aspects of the substrate system 20.

In particular, FIG. 3 illustrates an electronic circuit embodiment 50 in which a substrate system 52 is formed in a manner similar to the substrate system 20 of FIG. 1. LED die in the system 52 are arranged to form an electronic display 54 that can radiate light to define a set of characters such as the character 42 that was introduced in FIG. 2. An interdigitated keypad 55 is defined in another area of the substrate system and a flexible battery 56 is mounted to the opposite side of the substrate system. Various components (e.g., the LED die) can be bumped through the associated substrate to contact circuit leads in a conductive layer on the far side in a manner similar to that shown in FIG. 1. Although the battery 56 can be coupled to other circuitry by conventional processes, it can also be bumped through the associated substrate to contact circuit leads in a conductive layer on the near side of the substrate system.

FIG. 4 illustrates another electronic circuit embodiment 60 which is similar to the embodiment of FIG. 3 with like elements indicated by like reference numbers. In the embodiment 60, the keypad 55 of FIG. 3 has been simplified to a smaller keypad 65 that is arranged below the display 54 to form a substrate system 62. In the embodiment 60, the flexible battery 56 is now arranged to be coplanar with the substrate system and electrically coupled to it through connecting tabs 68. As shown in FIG. 1, the keypads 55 can be located on the lower conductive layer 23.

Attention is now redirected to another electronic circuit 78 that is formed with a substrate system 80 as shown in FIG. 5. This system is also suited for packaging a wide range of circuit elements such as semiconductor dies 81, LED dies 82, and various other electronic components 83. FIGS. 5A and 5B illustrate a method for fabricating the system 80.

As shown in an initial process of FIG. 5, various electronic elements (e.g., silicon (Si) die 81, LED die 82 and electronic component 83) are properly positioned over a substrate carrier 86 and secured to the carrier with an adhesive film 87. This film is preferably double-sided adhesive film and it may be sensitive to radiation (e.g., ultraviolet light) for ease of removal. In another process, the bonding pads of the electronic elements are covered with bumps 36 (e.g., shaped in the form of balls, discs or pads) that can be formed, for example, with solder or conductive epoxy.

FIG. 5 also illustrates a dielectric substrate 90 which, similar to the substrate 22 of FIG. 1, can be formed of various substrate materials (e.g., polyimide and liquid crystal polymers) that cause it to be flexible or can be formed of other materials (e.g., FR4) that cause it to be substantially rigid. The substrate 90 is prepared with openings in the form of apertures 91 that are positioned to receive the electronic elements 81, 82 and 83. The substrate carries metallic (e.g., copper) plating 92 formed to define electronic interconnections such as signal lines, ground planes, and vias 93. Holes 96 are formed in the signal lines and ground planes and each of these holes is positioned to receive a respective one of the bumps 36.

After these preparation processes, the carrier 86, its adhesive film 87 and its supported electronic elements (81, 82, 83) are moved as indicated by movement arrow 98 so that the elements enter respective apertures 91 with their bumps 36 each situated within and substantially coplanar with a respective one of the holes 96. This arrangement is fixed by the adhesive film 87 which now adheres to the near side of the substrate 90 and its metallic ground plane and/or signal lines.

As indicated by another process arrow 100, the bumps 36 can now be reflowed (e.g., by application of heat) so that they each flow out to form a conductive disc that contacts the edges of a respective one of the holes 96. Accordingly, they are now substantially coplanar with the metallic plating 92 and conductively fill a hole as shown by exemplary conductive discs 99 that are indicated by cross hatching. When contacting a signal line, for example, the conductive discs are substantially coplanar with that signal line. Although the carrier 86 can be left in place, it may also be removed by applying radiation (e.g., ultraviolet light) to the adhesive film 87 to thereby detach it and the carrier 86.

It is particularly noted that in the substrate system 20 of FIG. 1, electronic elements are positioned below an upper conductive layer 24 and bumped to the near side of that layer. In contrast, the electronic elements in FIG. 5 are positioned below an upper conductive layer but they are coupled to signal lines and/or ground planes by bumps in the form of the conductive discs 99 that fill holes 96 and are thus substantially coplanar with the signal lines and ground planes. Although they generally take the form of discs, the bumps 36 may also be referred to herein as bumps because their use is similar to that of the solder bumps 36 in FIG. 1.

In a connective structure embodiment, the discs 99 may be positioned and processed in accordance with the "tacky dot" technology which forms a photoimageable adhesive into a pattern of tacky areas which can be subsequently populated with conductive particles (e.g., solder balls) and transferred to integrated circuits (it is noted that the tacky dot technology has been donated to University of California at San Diego by the DuPont Corporation).

As shown in the final upper configuration of FIG. 5, the electronic components can be secured in their apertures 91 with non-conductive polymer 38 to increase the system's physical integrity. In an embodiment with LED dies that emit light rays 41, the polymer 38 can be configured to enhance the index of refraction to thereby increase photon output. In other embodiments, diffusion elements (e.g., phosphors, $TiO_2$, and quartz beads) can be imbedded in the polymer 38 so that it acts as a diffusion element to diffuse the light emitted from the LEDs. Other lens materials (e.g., holographic materials) can be used to enhance the LED light.

It is also noted that additional electronic elements may be bumped to the far side of the signal lines and/or ground planes as exemplified by elements 81A and 83A (shown prior to the bumping) and by bumping arrow 101. If needed, a non-conductive film 102 (e.g., a solder mask) may be inserted to isolate the bodies of these components from other signal lines. In this final configuration, electronic elements 81, 82 and 83 are positioned beneath the signal lines 92 and other electronic elements 81A and 83A are positioned above the signal lines.

FIG. 6 illustrates another electronic circuit 108 formed with a substrate system embodiment 110 which has elements similar to those of the system 80 of FIG. 5 with like elements indicated by like reference numbers. In this embodiment, however, bumps in the form of conductive pads 114 are used to electronically connect the circuit elements (e.g., semiconductor dies 81, LED dies 82, and various other electronic components 83) to the near side of the signal lines and/or ground planes 92. These pads 114 can be formed, for example, by screened-on conductive pastes or films formed, for example, of conductive material (e.g., solder or epoxy).

The structure of FIG. 6 is similar to the structure of FIG. 1 except that the components 81, 82 and 83 are bumped to the near side of the signal paths 92 with solder bumps 36 in FIG. 1 and are specifically bumped to the near side of the signal paths 92 with pads 114 in FIG. 6. Because the pads are formed of conductive epoxy, their shape may differ from that of the solder bumps. Although they may generally take the form of discs, however, the pads 114 may also be referred to herein as bumps because their use is similar to that of the solder bumps 36 in FIG. 1. Although the shape differs, the structural concept is the same.

FIG. 7 is a chart 118 that summarizes several parameters of the bumps that have been disclosed with reference to FIGS. 1-6. As shown, the configuration (i.e., shape or form) of the bumps may include balls, discs, pads and film whose composition may include eutectic solder (a solder mix that transitions directly between solid and liquid states), conductive epoxy and anisotropic structures (e.g., film). These bumps may have been prepared by processes that include etched, lasered, screened, roll stamped and vertical stamped.

These bumps may be applied to circuit elements (e.g., Si die, LED die, electronic component) either before they are inserted into substrate apertures or after such insertion in the case of eutectic bumps or conductive epoxy bumps. In addition, they may be arranged to abut the substrate side of signal lines (i.e., near side of signal lines) or may be arranged coplanar with such lines (e.g., inserted into holes in the lines). Once installed, the bumps may be affixed by processes that include reflowing and curing and the application of heat or heat and pressure. These connective element structures and methods provide advantages which include enhanced part thinness, density and heat flow.

FIG. 8 illustrates that structures disclosed in FIGS. 1-6 may be configured as substrates that function as elements (e.g., display, processor and memory) that form a complex stacked substrate system 120. For example, the electronic circuit 78 of FIG. 5 is shown at the lower portion of FIG. 8 wherein it has been configured as a display keyboard. A similar electronic circuit 122 has been configured as a signal processor 122 and positioned over the electronic circuit 78. Preferably, the non-conductive film 102 (e.g., a solder mask) of FIG. 5 is inserted between the circuits 78 and 122. Another similar electronic circuit 124 has been configured as a memory 124, flipped over, and positioned over the processor. Another non-conductive film 102 is inserted between the circuits 122 and 124. The interconnection (e.g., through holes in the film 102) between the stacked circuits can be achieved with solder, conductive epoxy, "tacky dots", micro eutectic discs, and/or anisotropic contacts.

The embodiments of the disclosure described herein are exemplary and numerous modifications, variations and rearrangements can be readily envisioned to achieve substantially equivalent results, all of which are intended to be embraced within the spirit and scope of the appended claims.

I claim:

1. A substrate system to carry at least one circuit element that has at least one bonding pad, the system comprising:
   a substrate having first and second sides and configured to form at least one opening that communicates between said first and second sides;
   at least one conductive circuit path carried on said first side and extended over said opening wherein said circuit path has a near side facing said substrate and has a far side facing away from said substrate; and
   a conductive bump arranged to join said pad to said path.

2. The system of claim 1, wherein said substrate is a dielectric substrate.

3. The system of claim 1, wherein said conductive bump joins said pad to said near side.

4. The system of claim 3, wherein said bump comprises solder so that the application of heat joins said bonding pad to said near side.

5. The system of claim 3, wherein said bump comprises conductive epoxy so that the application of at least one of heat and radiated energy joins said pad to said near side.

6. The system of claim 3, wherein a second circuit element has at least one second bonding pad and further including:
   a second conductive circuit path carried on said first side and having a near side facing said substrate and a far side facing away from said substrate; and a conductive bump positioned to join said second bonding pad to the far side of said second path.

7. The system of claim 3, further including a lens positioned over a light-emitting diode of said circuit element.

8. The system of claim 7, wherein said opening is one of a plurality of openings arranged to form a character.

9. The system of claim 3, further including a non-conductive polymer arranged to secure said circuit element in said opening.

10. The system of claim 3, further including an insulating layer inserted between said substrate and at least a portion of said circuit path.

11. The system of claim 1, wherein:
said circuit path defines at least one hole positioned over said opening; and
said conductive bump fills said hole to thereby join said pad to said path.

12. The system of claim 11, wherein said bump comprises solder so that the application of heat joins said bonding pad to said circuit path.

13. The system of claim 11, wherein said bump comprises conductive epoxy so that the application of at least one of heat and radiated energy joins said pad to said circuit path.

14. The system of claim 11, wherein a second circuit element has at least one second bonding pad and further including:
a second conductive circuit path carried on said first side and having a near side facing said substrate and a far side facing away from said substrate; and
a conductive bump positioned to join said second bonding pad to the far side of said second path.

15. The system of claim 11, wherein said circuit element includes a light-emitting diode and further including a lens positioned over said diode and configured to transform light emitted from said diode.

16. The system of claim 11, wherein said circuit element includes passive components.

17. The system of claim 11, further including a non-conductive polymer arranged to secure said circuit element in said opening.

18. The system of claim 1, wherein:
said opening includes a recess in said substrate to receive said circuit element and further includes at least one via that communicates between said recess and said circuit path; and
said bump is received in said via to thereby join said pad to said near side.

19. The system of claim 18, wherein said bump comprises solder so that the application of heat joins said bonding pad to said near side.

20. The system of claim 18, wherein said bump comprises conductive epoxy so that the application of at least one of heat and radiated energy joins said pad to said near side.

* * * * *